(12) United States Patent
Davis

(10) Patent No.: US 7,804,691 B1
(45) Date of Patent: Sep. 28, 2010

(54) ASSEMBLY FOR PROTECTING PC CARDS AND PERIPHERAL CONNECTORS

(75) Inventor: Ted Davis, Conyers, GA (US)

(73) Assignee: Utility Associates, Inc., Covington, GA (US)

( * ) Notice: Subject to any disclaimer, the term of this patent is extended or adjusted under 35 U.S.C. 154(b) by 763 days.

(21) Appl. No.: 11/750,804

(22) Filed: May 18, 2007

Related U.S. Application Data

(60) Provisional application No. 60/747,539, filed on May 18, 2006.

(51) Int. Cl.
H05K 5/00 (2006.01)

(52) U.S. Cl. .................................. 361/752; 361/801

(58) Field of Classification Search .............. 361/752, 361/790, 797, 800, 801–803
See application file for complete search history.

(56) References Cited

U.S. PATENT DOCUMENTS

| | | | |
|---|---|---|---|
| 3,811,104 A * | 5/1974 | Caldwell | 439/135 |
| 4,662,697 A * | 5/1987 | Moses | 439/148 |
| 5,769,646 A | 6/1998 | Cavello et al. | |
| 5,973,925 A | 10/1999 | Kraemer | |
| 6,099,355 A | 8/2000 | Johnson et al. | |
| 6,139,338 A | 10/2000 | Hirai et al. | |
| 6,244,903 B1 | 6/2001 | Johnson et al. | |
| 6,351,388 B1 | 2/2002 | Jenkins et al. | |
| 6,813,158 B2 | 11/2004 | Yanagi | |
| 6,914,189 B1 | 7/2005 | Ling et al. | |
| 2003/0016492 A1 | 1/2003 | Yanagi | |
| 2003/0032334 A1 | 2/2003 | Johnson et al. | |
| 2004/0022035 A1 | 2/2004 | Chang | |
| 2004/0147151 A1 | 7/2004 | Koser | |
| 2005/0268673 A1 | 12/2005 | Bakker et al. | |
| 2006/0002079 A1 | 1/2006 | Xu et al. | |

* cited by examiner

Primary Examiner—Hung S Bui
(74) Attorney, Agent, or Firm—Morris Manning Martin LLP; John R. Harris, Esq.; Daniel E. Sineway, Esq.

(57) ABSTRACT

An assembly for protecting a PC card and a USB device that are connected to an electronic device in corresponding ports includes a PC card protector and a USB connector clip. The PC card protector includes a base plate and at least two side plates connected thereto to substantially surround the PC card. The PC card protector may include a housing having a recessive area surrounding the port, with a recess cover detachably attached to the housing to surround the recessive area and allow transmission and reception of a signal via the PC card. A USB protector clip may be connected to the PC card protector, with the USB protector clip having a USB protector base, two side plates connected to said USB protector base, two side walls connected to said USB protector base, and an extension connected to the electronic device.

7 Claims, 10 Drawing Sheets

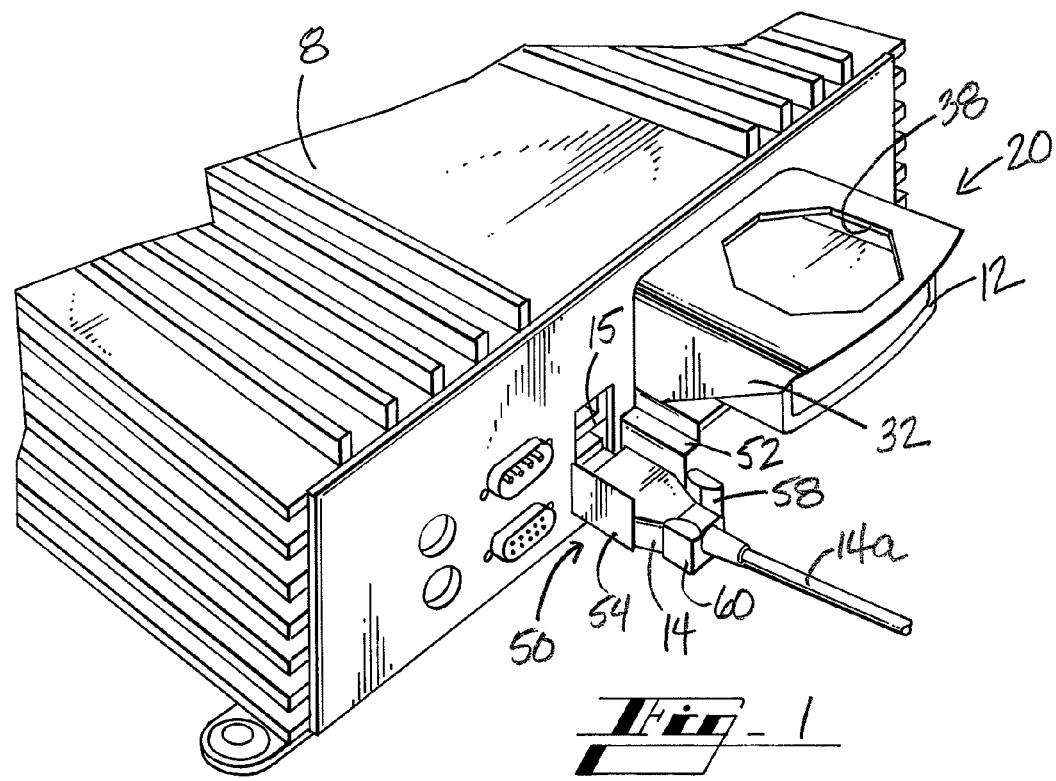
Fig_1
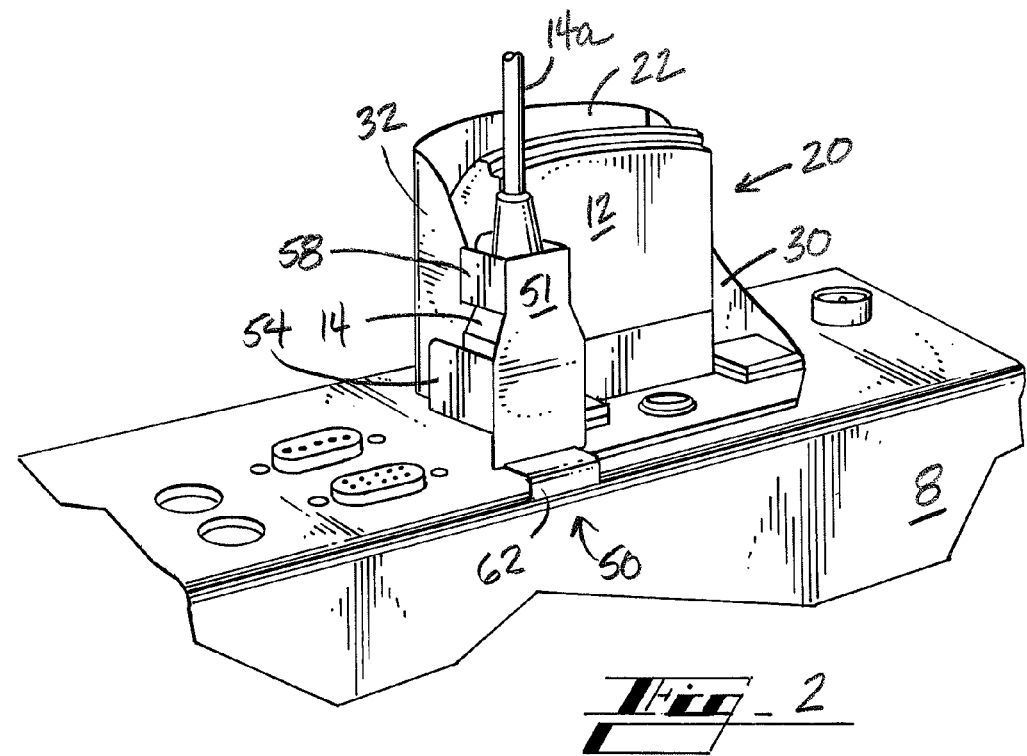
Fig_2

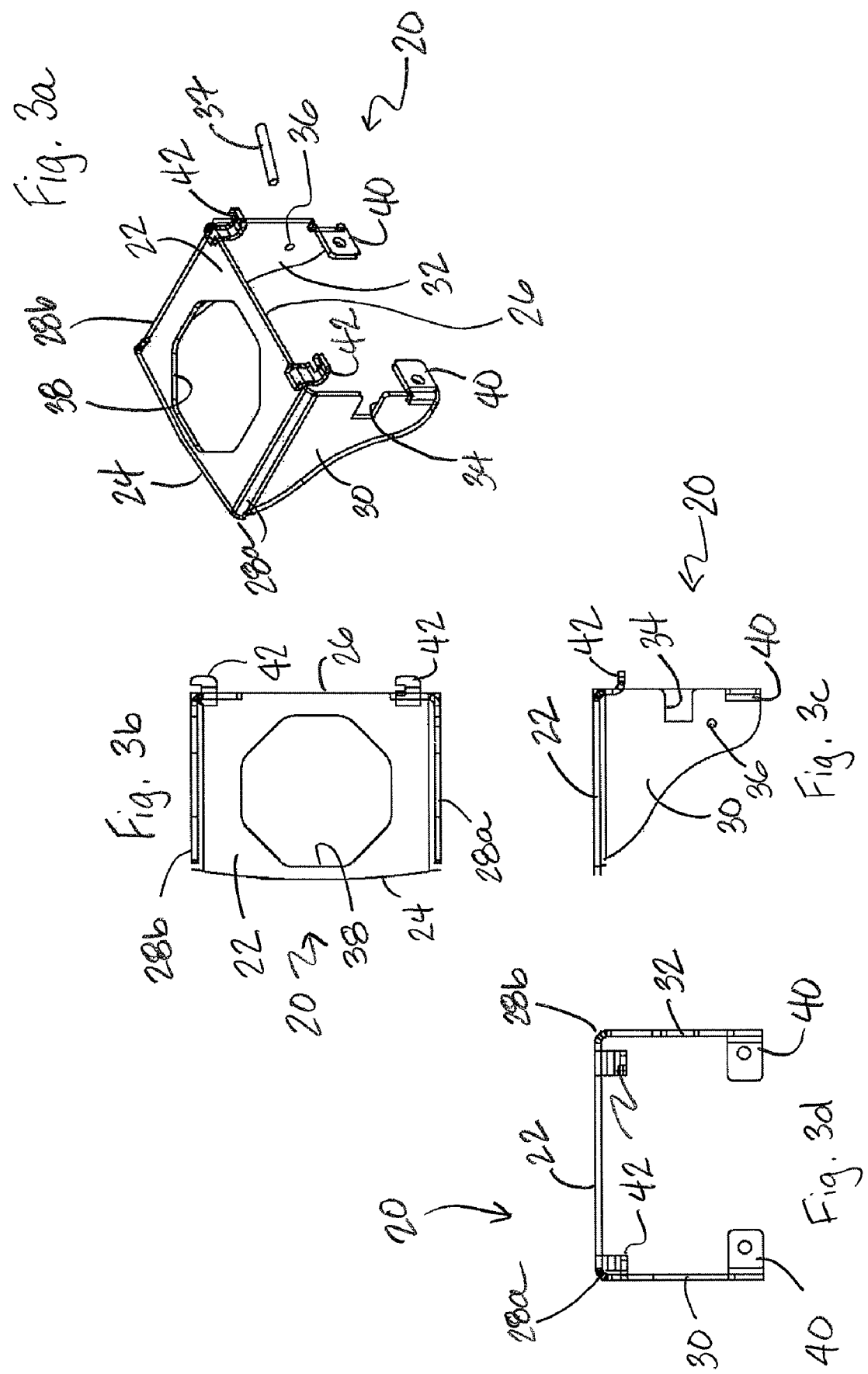

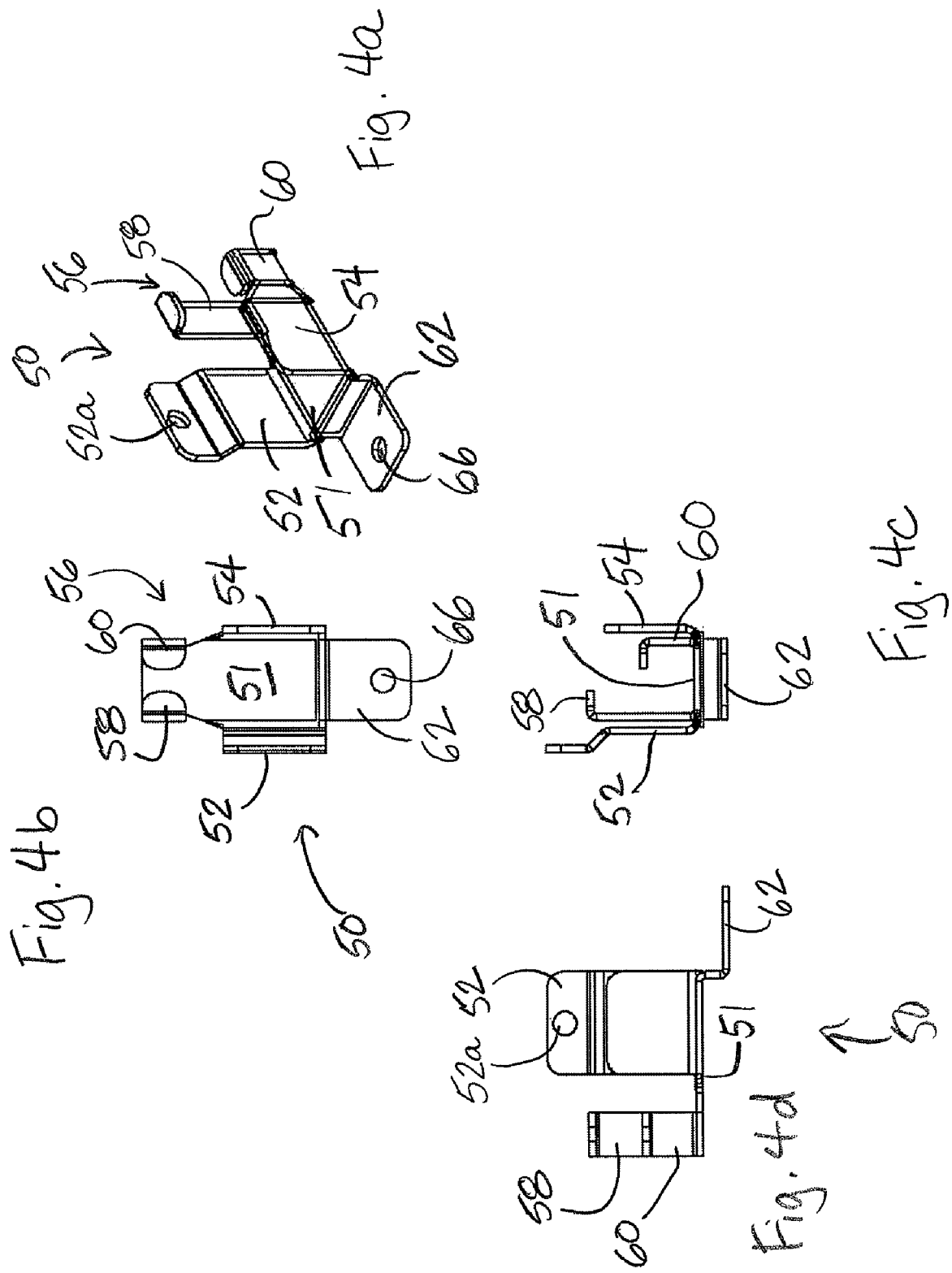

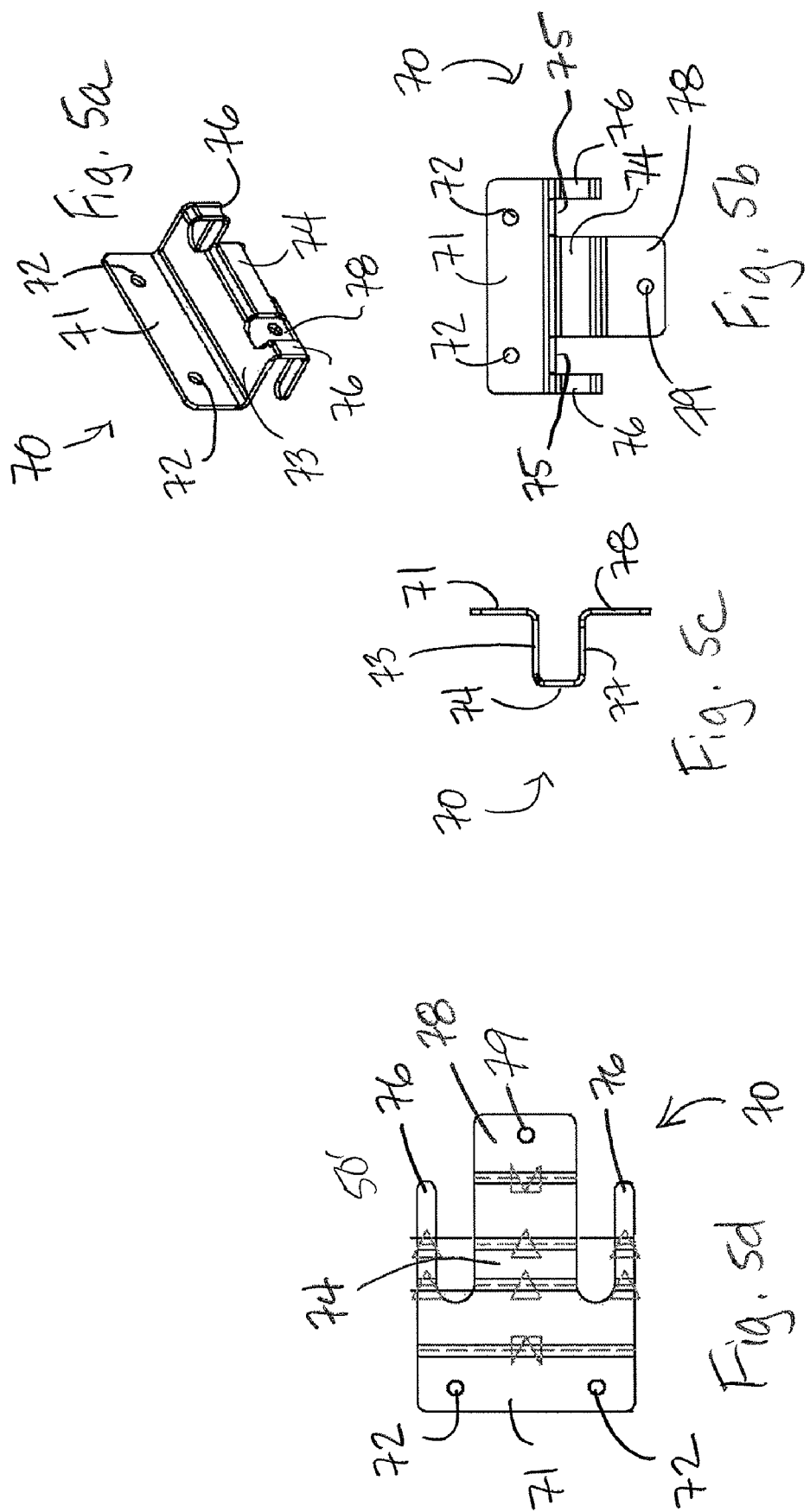

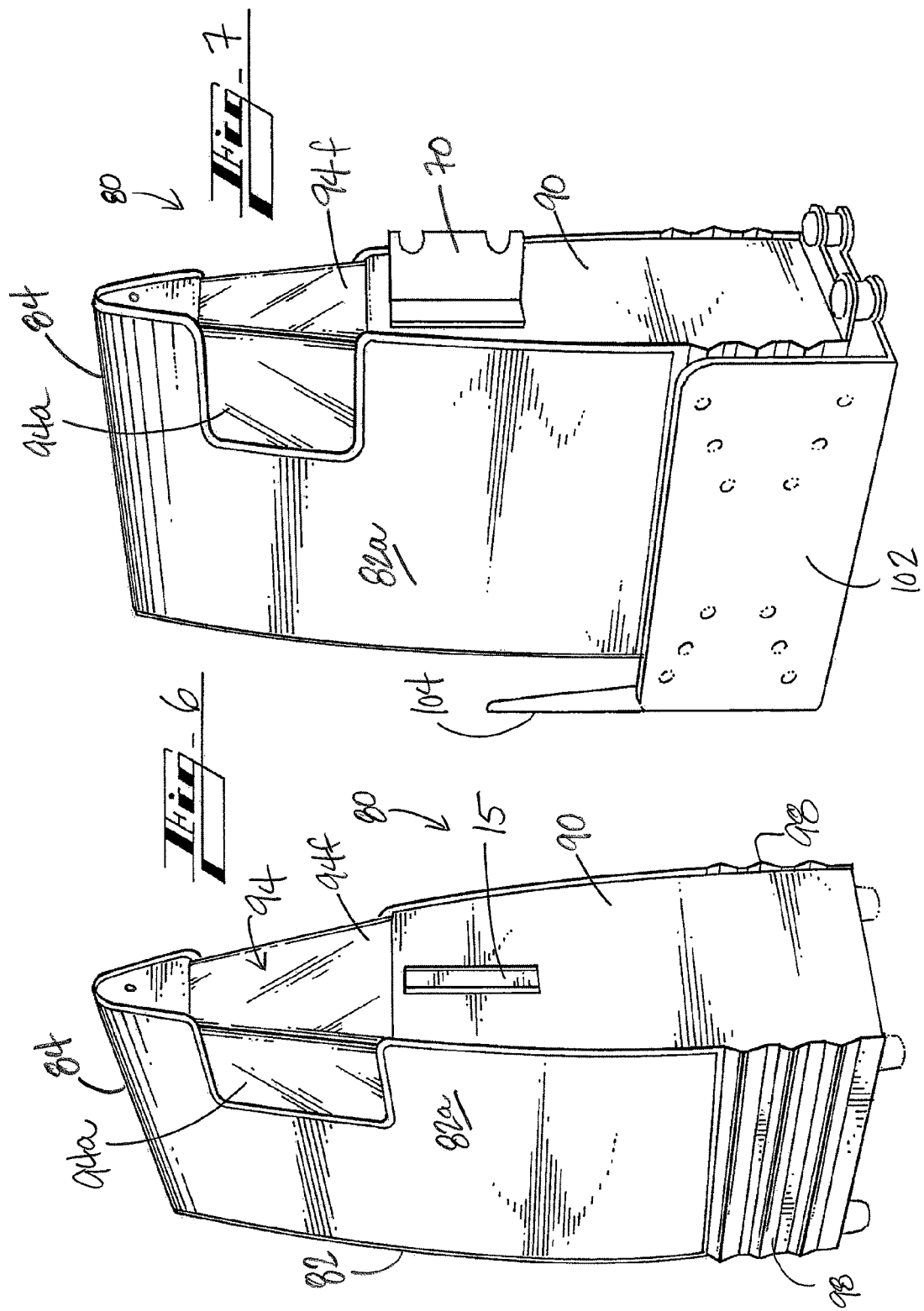

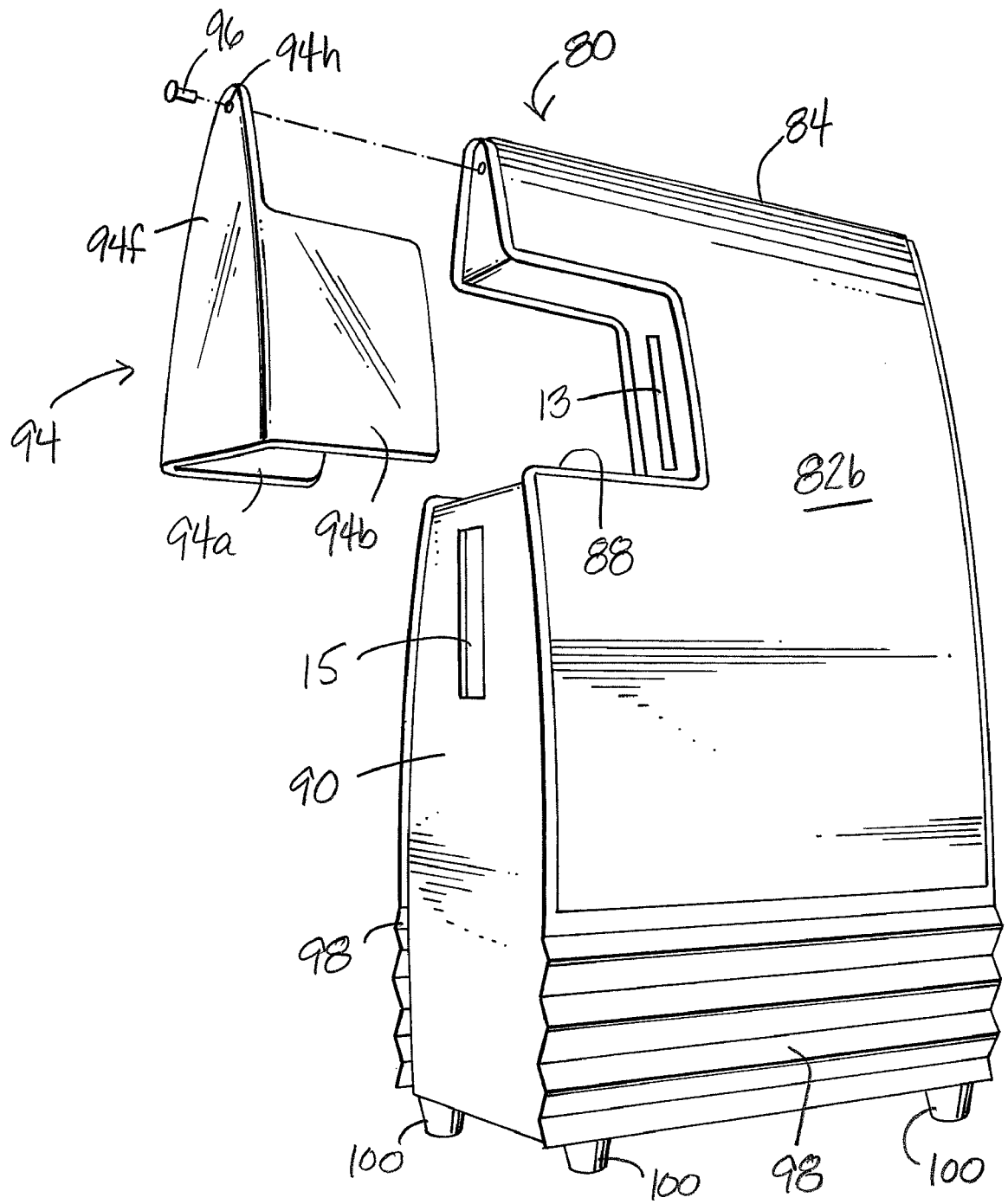

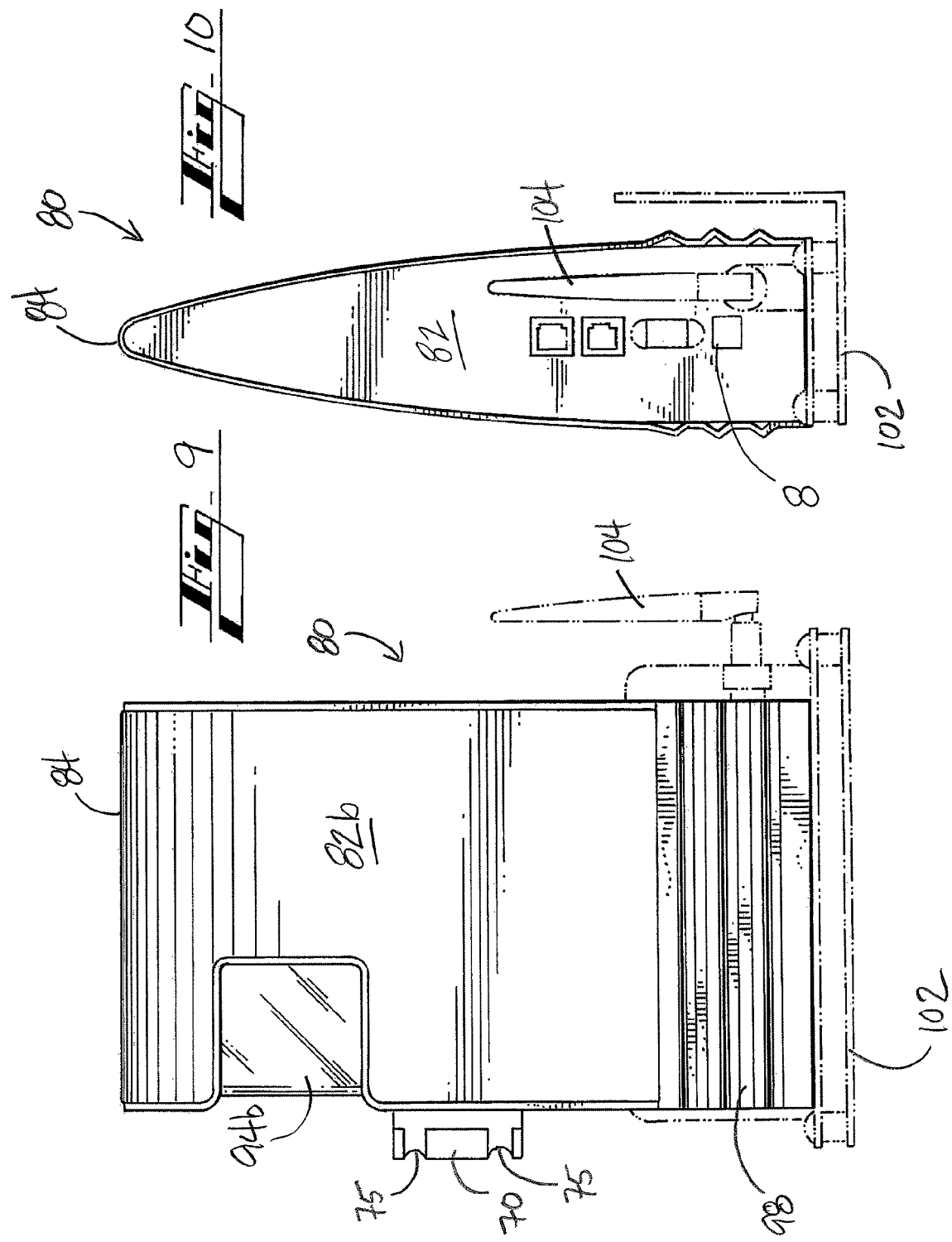

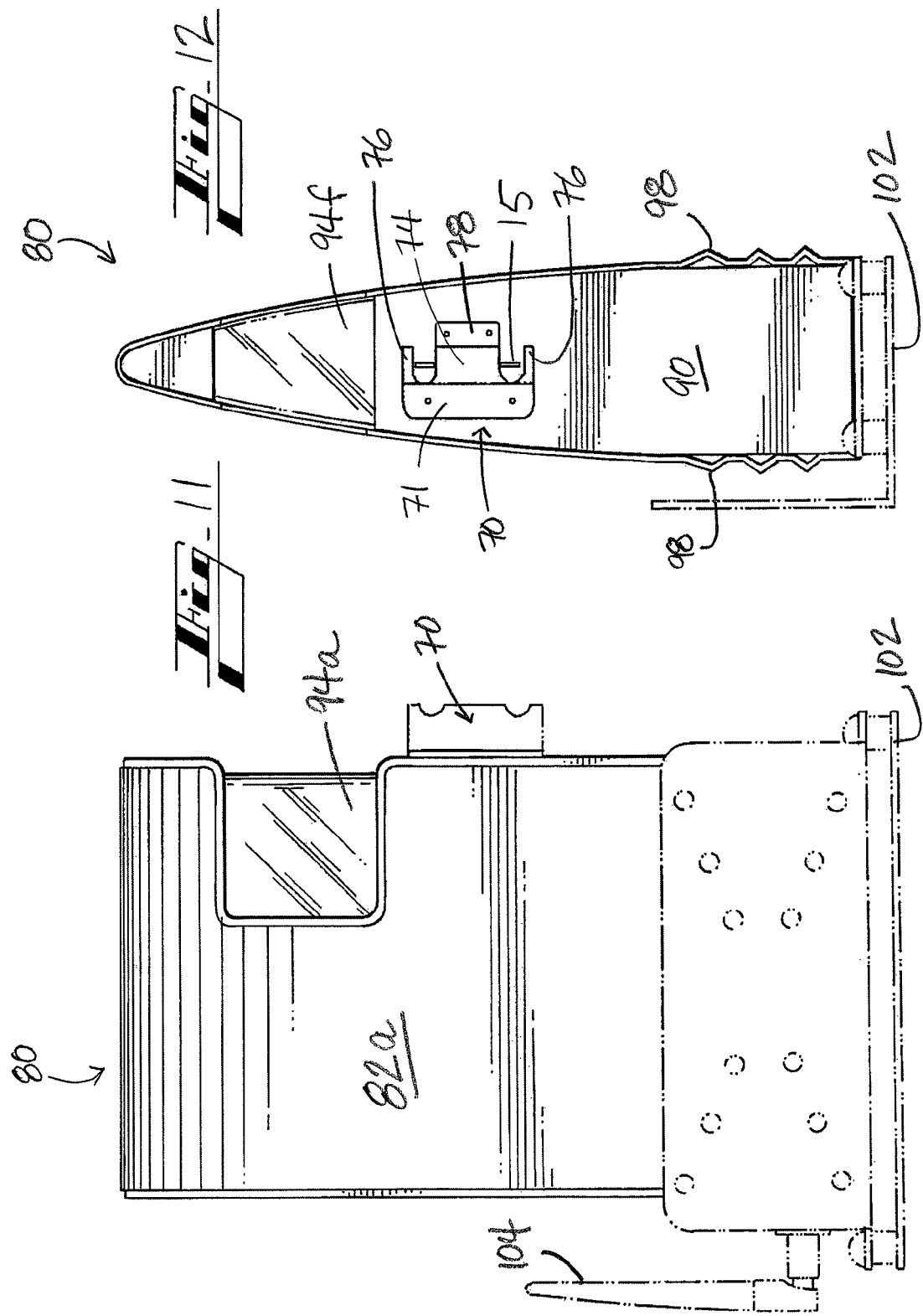

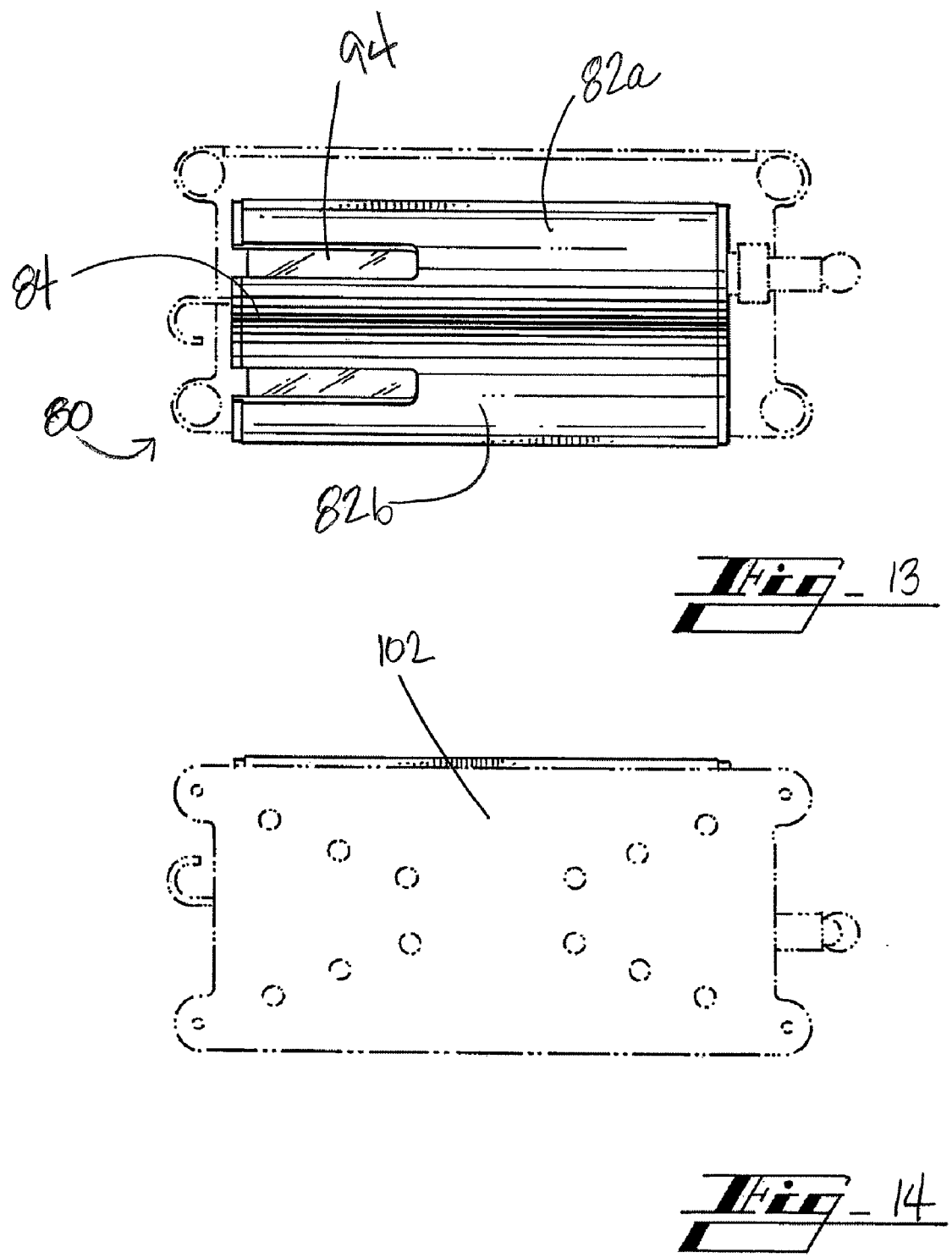

ASSEMBLY FOR PROTECTING PC CARDS AND PERIPHERAL CONNECTORS

CROSS REFERENCE TO RELATED PATENT APPLICATIONS

This non-provisional patent application claims priority from provisional patent application 60/747,539, filed on May 18, 2006, which is relied upon and incorporated herein by reference.

FIELD OF THE INVENTION present invention relates to protectors for PC cards and computer connectors, and, more particularly, to protectors that shield connectors and PC cards extending away from a central processing unit or similar device.

BACKGROUND OF THE INVENTION

A PC card is a small memory or I/O device that slides into various electronic devices, such as a notebook or laptop computer. More specifically, PC cards are interchangeable peripherals designed to be inserted into computer ports in order to enable additional hardware functions, such as adding memory or mass storage to a computer. One of the most common uses of a PC Card is as a telecommunications modem that is used with notebook computers, and the power and versatility of PC cards has made them commonly used equipment in mobile notebook computers.

In addition to PC cards, other peripheral devices are connected to related ports on the computer, typically using connectors such as a universal serial bus (USB) port. A USB connector is a plug-and-play interface between a computer and various peripheral devices, such as audio players, joysticks, keyboards, telephones, scanners, and printers. Like PC cards, USB connectors extend from the personal computer to connect the peripheral device with the computer.

A problem commonly encountered with both PC cards and USB connectors during the ordinary course of use is that the PC cards and USB connectors extend beyond the housing of the personal computer or electronic device, such that the PC card or USB connector are prone to damage, particularly when the associated personal computer is in a mobile environment, and can make undesired contact with various surfaces. Furthermore, any undesired contact of the PC card or USB connector would harm not only the respective item, but also the personal computer at the connection point of the PC card or USB connector.

BRIEF DESCRIPTION OF THE DRAWINGS

FIG. 1 is a perspective view of a computing device with an apparatus for protecting PC cards and peripheral devices attached thereto;

FIG. 2 is a bottom perspective view of the apparatus illustrated in FIG. 1;

FIG. 3a is a perspective view of a PC card protector;

FIG. 3b is a top plan view of the PC card protector illustrated in FIG. 3a;

FIG. 3c is a left side view of the PC card protector illustrated in FIG. 3a;

FIG. 3d is a front side view of the PC card protector illustrated in FIG. 3a;

FIG. 4a is a perspective view of a USB protector;

FIG. 4b is a top plan view of the USB protector illustrated in FIG. 4a;

FIG. 4c is a left side view of the USB card protector illustrated in FIG. 4a;

FIG. 4d is a front side view of the USB protector illustrated in FIG. 4a;

FIG. 5a is a perspective view of a second embodiment of a USB protector;

FIG. 5b is a top plan view of the USB protector illustrated in FIG. 5a;

FIG. 5c is a left side view of the USB protector illustrated in FIG. 5a;

FIG. 5d is a front view of an extended USB protector corresponding to the USB protector illustrated in FIG. 5a;

FIG. 6 is a perspective view of second embodiment of a PC card protector;

FIG. 7 is a perspective view of the PC card protector illustrated in FIG. 6, with a mounting apparatus and antenna attached thereto;

FIG. 8b is an exploded view of the PC card protector illustrated in FIG. 6 with a PC card removed;

FIG. 9 is a right elevational view of the PC card protector with mounting apparatus illustrated in FIG. 7;

FIG. 10 is a front elevational view of the PC card protector with mounting apparatus illustrated in FIG. 7;

FIG. 11 a left elevational view of the PC card protector with mounting apparatus illustrated in FIG. 7;

FIG. 12 a front elevational view of the PC card protector with mounting apparatus illustrated in FIG. 7;

FIG. 13 is a top plan view of the PC card protector with mounting apparatus illustrated in FIG. 7; and FIG. 14 is a bottom view of the base of the mounting apparatus of the PC card protector illustrated in FIG. 7.

DESCRIPTION OF THE INVENTION

Figure 8A:
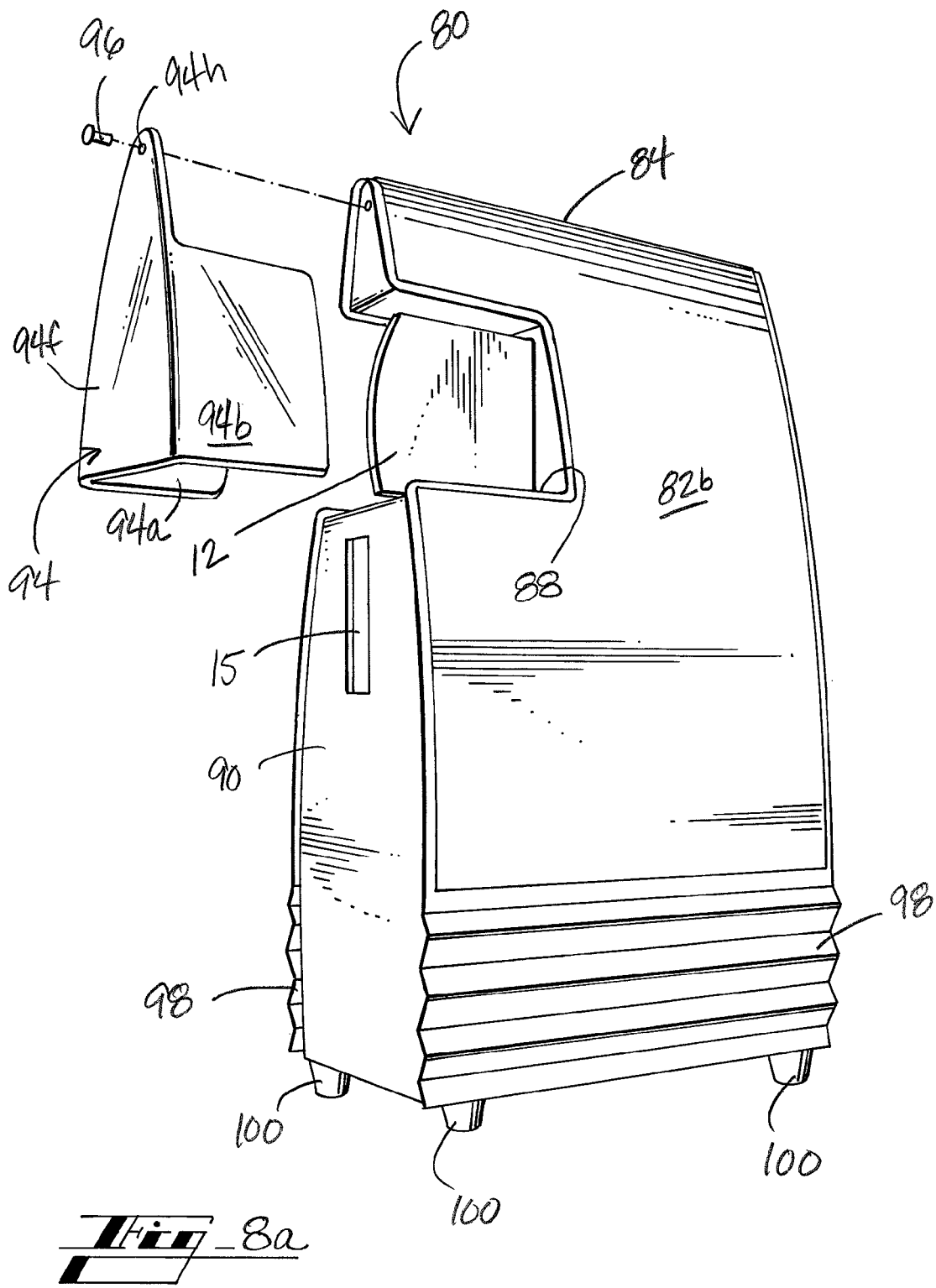
FIG. 8a is an exploded view of the PC card protector illustrated in FIG. 6 with a PC card inserted.

A protective assembly 10 is illustrated and described herein to shield PC cards 12 and connectors 14 for peripheral devices, such as USB connectors, from damage in harsh and unstable working environments is illustrated in the attached drawings. The apparatus 10 includes various embodiments for protecting both PC cards 12 and USB connectors 14 concurrently or independently. In addition to the protection of the PC cards 12 and USB connectors 14, the apparatus 10 is also designed to maintain the devices and connectors proximate an electronic device 8, such as a personal computer, router or other mobile computing device, for proper operation of the device 8 as well as any peripheral devices connected therewith, such as a global positioning system antenna.

Looking further to FIGS. 1 and 2, the apparatus includes a PC card protector 20 for protecting PC cards 12 and a USB protector clip 50 for protecting USB connectors 14 connected to the electronic device 8 via a USB port or slot 15. The PC card protector 20 may be made out of a rigid material, such as steel, to provide a rugged plate 20 surrounding that portion of the PC card 14 that extends beyond the main body of the electronic device 8. The PC card protector 20 includes a base plate 22 that is illustrated as having a front edge 24 and a back edge 26 connected by two opposing side edges 28a, 28b.

Extending downwardly from both side edges 28a, 28b of the base plate 22 are two side plates 30, 32. The side plates 30, 32 have substantially similar mirrored shape. The first side plate 30 includes a notch 34 that corresponds to the position of an eject button of the electronic device 8. This notch 34 allows the ejection button to extend outward from the electronic device 8 so that it will operate as usual when the PC card protector 20 is affixed to the electronic device 8. Further, the second side plate 32 includes a small hole 36 to receive a pin 37. The hole 36 will enable the insertion of a pin 37 to keep the PC card 12 from vibrating and loosening from the PC card slot 13 in the electronic device 8.

An opening 38 traverses the base plate 22 of the PC card protector 20. The opening 38 is of sufficient size and shape (for example, circular, square, triangular, octagonal, etc.) to not interfere with typical wide area and local wireless networks, but it is not to big to jeopardize the protection provide by the PC card protector 20. Consequently, this opening 38 allows the PC card protector 20 to protect those PC cards 12 that are used as a telecommunications modem. An antenna notch may be positioned adjacent the opening 38. The antenna notch would traverse the PC card protector 20 proximate the opening 38 to enable a typical PC card antenna to be raised through the PC card protector 20 for any necessary transmission.

Each side plate 30, 32 includes a lower tab 40 opposite the base plate 22. The tabs 40 are positioned at a right angle with respect to the side plates 30, 32, and used to fasten the PC card protector 20 to the main body of the electronic device 8, and thereby keep the PC card protector 20 stable once connected to the electronic device 8.

In addition to the lower tabs 40, two upper hooks 42 may be used to hold the PC card protector 20 in place with respect to the main body of the electronic device 8. The upper hooks 42 are positioned on the back edge 26 proximate the side edges 30, 32, respectively. The upper tabs 8 may extend into a groove in the electronic device 8 to further stabilize the position of the PC card protector 20 with the electronic device 8.

The PC card protector 20 of the present invention facilitates normal use of PC cards 12, enabling the PC cards 12 to be inserted or expelled safely from the electronic device 8. One benefit of the apparatus is for protection of both the PC card and the connection at the PC. That is, many PC cards 12 extend beyond the housing of the electronic device 8, such that the PC card 12 is prone to damage, particularly in mobile environments. Another use of the PC card protector 20 is to hold the PC card 12 in place with the electronic device 8 in unstable conditions that incur vibrations and shocks, such as use in moving vehicles.

Looking to FIGS. 1 and 2, the assembly 8 may additionally include a USB protector clip 50, which is illustrated in connection with the PC card protector 20. The USB protector clip 50 substantially surrounds the USB connector 14 to protect the USB connector 14 from damage in harsh and unstable working environments. Referring to FIGS. 4a-4d, the USB protector clip 50 includes a USB protector base 51 with two side plates 52, 54 on opposing borders of the USB protector base 51 that keep the USB connector 14 in place when connected with an electronic device 8. First side plate 52 extends above second side plate 54, and includes an aperture 52a so that the side plate 52 may be attached to the side edge 30 of PC card protector 20 (as shown in FIGS. 1 and 2). The USB protector clip 50 also includes a rear clip 56 defined by upper wall 58 and lower wall 60, with the rear clip 56 keeping the USB connector or plug 14 from backing out of computer receptacle.

At the base of the USB protector clip 50 is a nipple 62 that extends beyond the first and second side plates 52, 54. The nipple 62 may be inserted into a slot in the electronic device 8, thereby enabling the USB protector clip 50 to be securely fastened to the electronic device 8. Once inserted into the electronic device 8, a fastening screw 64 may be inserted through the computer housing to engage an aperture 66 in the USB clip nipple 62, thereby holding the USB protector clip 50 in place. When this fastening screw 64 is inserted, the USB protector clip 50 cannot be unplugged from the computer, and will provide a resolute shield for the USB connector 14.

A second embodiment of the USB protector clip 70 is illustrated in FIGS. 5a-5d. In this embodiment, the USB protector clip 70 includes a support plate 71 having at least one connecting aperture 72. An intermediate plate 73 is substantially perpendicularly connected to the support plate 71. A center plate 74 and two side arms 76 extend perpendicularly from the intermediate plate 73, with a pair of cord slots 75 defined between the center plate 74 and the side arms 76. A second intermediate plate 77 is substantially perpendicularly connected with the center plate 74, with a secondary support plate 78 connected with said second intermediate plate 77 such that the secondary support plate 78 lies in the same plan as the support plate 71. A connecting aperture 79 traverses the secondary support plate 78, with each of the connecting apertures 72, 79 being used to receive a connecting member, such as a screw, to connect the USB protector clip 70 to the housing of an electronic device 8.

When installed onto the housing of an electronic device 8 proximate a USB or other port 9, the USB protector clip 70 will keep the USB connector 14 in place when connected with the port 9 of the electronic device 8. That is, the cord 14a connected to the USB connector 14 will be able to extend through the cord slots 75 while the center plate 74 and two side arms 76 prevent the removal of the USB connector 14.

Looking to FIGS. 6 through 14, a second embodiment of the PC card protector 80 for a protective assembly 10 is illustrated. In this embodiment, the electronic device 8 is stored in a protective housing 82 that also serves to protect the PC card 12 (see FIG. 8) while allowing wireless transmissions between the PC card 12 and another transmitter or receiver. In particular, the housing 82 is made of a rigid and sturdy material, such as steel, and has a sloping A-frame or A-shape, with two side walls 82a, 82b connected together at a first end point or apex 84 and separated by a flooring 86 opposite the first end 84. A front wall 90 is connected between the side walls 82a, 82b and the flooring 86. Opposite the first end 84, the side walls 82a, 82b each have an undulating shape, with the waves providing a set of small gaps that allow air to flow to the interior of the electronic device 8 unit for heat dissipation The A-shape of the housing 82 allows the assembly 10 to be installed in a vehicle, such as a pickup truck, behind one of the seats along the rear cab wall, where the seat is naturally in a reclining or slanted position. The sloping shape of the housing 82 also allows more flexibility in mounting the housing 82 in the truck of a vehicle or another location where the walls of the area naturally slope inward. The housing 82 can be mounted on the floor of the vehicle and follow the natural slope against the back seat. Or, contrarily, if the area slopes outward, the housing 82 could be mounted upside down to follow the slope of the space.

Referring to FIGS. 8a and 8b, a recession 88 is defined in each of the side walls 82a, 82b above the front wall 90 to define a recessed area in the housing 82 surrounding a PC card slot or port 13 to receive the PC card 12 and provide a connection between the electronic device 8 and the PC card 12. A recess cover 94 is designed to securely fit into housing 82 and surround the recessed area in the housing 82. More specifically, the recess cover 94 is three sided, with two side walls 94a, 94b having a shape corresponding to the recessions 88 and a front wall 94f. The recess cover 94 may be made of a variety of materials that allow the PC card 12 to receive and transmit wireless signals, such as a plastic or polycarbonate material. Furthermore, the recess cover 94 may be transparent or smoked, which will allow the user to see the connect status indicator light on the wireless broadband PC cards 12 that is illuminated when the electronic device 8 is in operation.

The recess cover 94 may slide into and out of connection with the housing 82, and may be connected to the housing 88 in a variety of different ways, such as through the use of a connector 96 or through a press fit. In the embodiment illustrated in FIG. 8, an aperture 94h traverses the front wall 94f of the recess cover 94 to allow the connector 96 (such as a pin or screw) to secure the recess cover 94 to the housing 82, and can easily be attached and detached to remove and replace the PC card 12 as needed by the user.

The PC card protector 80 shields an inserted wireless broadband PC card 12 from damage. The steel case housing 82 and recess cover 94 protect the wireless PC card 12 from all sides while still allowing the PC card 12 to be visible. This limits any interference by the steel case 82 while the PC card 12 is transmitting or receiving a signal. That is, the recess cover, which may be made of plexiglass or polycarbonate material, will not block the signal transmitted to or received from the wireless PC card 12 as steel does. More specifically, the PC card 12 will have approximately at least a 300 degree window through recess cover 94 to receive or transmit a signal.

Furthermore, the electronic device 8 or computer housed in the PC card protector 80 also has USB slots 15 to connect the electronic device 8 with peripheral devices. Thus, a USB protector 70 as described above may be attached to the housing 82 to protect the USB connectors 14 and keep them from being removed from the housing 82. Additionally, other conventional connections, such as to a power supply or other peripheral devices, will also be provided in or through the housing 82 of PC card protector 80.

A mounting bracket 102 may be further connected to the housing 82. The mounting bracket 102 provides a degree of flexibility to dampen shocks from impacts and vehicle vibrations when the PC card protector 80 and electronic device 8 are used in a vehicle. The mounting bracket 102 further assists the user in positioning the PC card protector 80 in either in a horizontal or vertical orientation, as desired by the user and the surrounding environment, and may include an antenna 104 connectable to the electronic device 8. Of course, the PC card protector 80 and electronic device 8 may be used without the mounting bracket 102 as an office device that provides WiFI internet access in an office where there is no wired DSL or Cable Modem internet access available, such as a construction trailer, a FEMA emergency management trailer, etc. It may just sit on the bottom rubber feet 100 on a shelf or desk.

Having thus described exemplary embodiments, it should be noted by those skilled in the art that the within disclosures are exemplary only and that various other alternatives, adaptations, and modifications may be made within the scope of this disclosure as described herein and as described in the appended claims.

What is claimed is:

1. An assembly for protecting a PC card and USB connector connected to an electronic device, said assembly comprising:
   a rigid PC card protector having
      a base plate with a front edge, a rear edge, and opposing first and second side edges between said front edge and said rear edge,
      a first card side plate connected to said first side edge, said first card side plate being substantially perpendicular to said base plate, a first tab connected to said first card side plate for attachment to the electronic device; and
      a second card side plate connected to said second side edge, said second card side plate being substantially perpendicular to said base plate, a second tab connected to said second card side plate for attachment to the electronic device; and
   a rigid USB protector clip connected to said PC card protector, said USB protector clip having
      a USB protector base having a forward border, a rear border, and first and second side borders between said rear and forward borders,
      a first USB side plate connected with said first side border and a second USB side plate connected to said second side border;
      a first USB side wall connected to said first side border;
      a second USB side wall connected to said second side border; and
      a nipple extending longitudinally from said forward border of said USB protector base for connection with the electronic device proximate a USB port.

2. The assembly as described in claim 1 further comprising an aperture traversing said base plate of said PC card protector.

3. The assembly as described in claim 1 further comprising hooking means connected to said rear edge of said base plate to connect said PC card protector with said electronic device.

4. The assembly as described in claim 1 wherein said first USB side plate extends substantially perpendicularly from said USB protector base a first distance, and said second USB side plate extends substantially perpendicularly from said USB protector base a second distance, said first distance being greater than said second distance.

5. The assembly as described in claim 1 wherein said first side wall extends substantially perpendicularly from said USB protector base a first distance, and said second side plate extends substantially perpendicularly from said USB protector base a second distance, said first distance being greater than said second distance.

6. The assembly as described in claim 1 wherein said nipple is offset from said USB protector base in a substantially parallel plane.

7. The assembly as described in claim 1 wherein said PC card protector and said USB protector each comprises steel.

* * * * *